United States Patent [19]
Rainal

[11] Patent Number: 5,519,353
[45] Date of Patent: May 21, 1996

[54] BALANCED DRIVER CIRCUIT FOR ELIMINATING INDUCTIVE NOISE

[75] Inventor: Attilio J. Rainal, Morristown, N.J.

[73] Assignee: AT&T Corp., Murray Hill, N.J.

[21] Appl. No.: 895,767

[22] Filed: Jun. 9, 1992

[51] Int. Cl.$^6$ ............................ H03K 17/16; H03K 1/00
[52] U.S. Cl. .................. 327/379; 327/403; 327/551; 327/108; 326/21; 326/30
[58] Field of Search ............................ 307/542, 520, 307/241, 242, 270, 605; 333/4, 5, 101; 327/379, 403, 551, 108; 326/21, 30

[56] References Cited

U.S. PATENT DOCUMENTS

| | | | |
|---|---|---|---|
| 4,700,152 | 10/1987 | Wilson | 333/5 |
| 4,812,689 | 3/1989 | Whiteley | 307/605 |
| 4,916,410 | 4/1990 | Littlefield | 333/5 |
| 5,053,731 | 10/1991 | Algiere et al. | 333/101 |
| 5,084,864 | 1/1992 | Turnbull et al. | 333/4 |
| 5,087,833 | 2/1992 | Sugai | 307/242 |

OTHER PUBLICATIONS

Katopis, G. A. "Delta–I Noise Specification for a High–Performance Computing machine", *Pro. of the IEEE*, vol. 73, No. 9, (1985) pp. 1405–1415.

Ghosh, J. et al. "Reduction of Simultaneous–Switching Noise in Large Crossbar Networks", *IEEE Trans. on Circuits and Systems*, vol. 38, No. 1 (1991) pp. 86–99.

Davidson, E. E. et al. "The Design of the ES/9000 Module" *IEEE Trans. on Comp. Hybrids, and Manufacturing Tech.*, vol. 14, No. 4 (1991) pp. 744–748.

*Primary Examiner*—Timothy P. Callahan
*Assistant Examiner*—Trong Phan
*Attorney, Agent, or Firm*—Eileen D. Ferguson; Eugen E. Pacher

[57] ABSTRACT

A balanced driver circuit which essentially eliminates inductive noise without a power dissipation penalty is disclosed. The balanced driver circuit is similar to a conventional balanced driver circuit however the circuit is impedance matched at both ends and has resistors connected in series with the outputs of the emitter followers in the chip. The resistors are equal in value to a termination resistor less the output impedance of the emitter followers. The impedance between the pair of signal leads, referred to as the primary and secondary leads is equal to the sum of the termination resistors. The current traversing the secondary lead has the same amplitude, but the opposite sign as the current traversing the primary lead. Thus, there is negligible current return through the common ground leads.

4 Claims, 3 Drawing Sheets

BALANCED DRIVER CIRCUIT FOR ELIMINATING INDUCTIVE NOISE

FIELD OF THE INVENTION

This invention relates generally to logic circuits and more specifically to logic circuits having on-chip balanced drivers which eliminate inductive noise.

BACKGROUND OF THE INVENTION

A major performance limitation of electrical interconnections is inductive noise encountered when one interconnects high-speed, high pin-out integrated circuit (IC) chips having many drivers that switch simultaneously. For example, an array size of 256×256 can be fabricated on a single chip, however such large arrays are impractical because of the inductive noise generated by the line drivers driving the output leads of the chip. When a large number of drivers are active simultaneously, a substantial transient current passes through the inductance of the ground and power distribution systems, causing a noise spike to emerge on the power and ground lines. The resulting fluctuation of the power and ground voltage levels can cause false switching of devices with an accompanying error or loss of data.

Several techniques have been proposed for reducing inductive noise. At the circuit level, the noise can be reduced by staggering the switching times of the drivers. The staggering of the switching times, however, has the drawbacks of decreased switching speed and increased complexity of clock distribution. At the architectural level, techniques such as the design rule, called the Simultaneous Switching Rule (SSR) can be used to limit the number of drivers that need to be activated simultaneously in a chip. The SSR is a linear inequality that restricts the number of driver circuits allowed to switch simultaneously, so that no logic errors will occur. The restrictions imposed by the SSR however translate into machine cycle time penalties and affect the performance rating of a machine. Thus, a compromise must be made when developing the SSR in order to minimize the impact on the machine cycle.

Other approaches also used to reduce inductive noise include chip attachment technologies such as solder bump leads and tape automated bonding (TAB). However, the use of these techniques is substantially more expensive than conventional wire bonding and has not achieved the reliability of wire bond technology. Since wire bonding is a mature and reliable technology with a large capital investment, it is desirable to reduce the inductive noise and retain the wire bond technology.

SUMMARY OF THE INVENTION

This invention is a balanced driver circuit which essentially eliminates inductive noise without a power dissipation penalty. The balanced driver circuit is similar to a conventional balanced driver circuit driving a balanced transmission line but the present driver circuit provides for impedance matching of the transmission line at both ends. This is accomplished by connecting resistors in series with the outputs of the emitter followers in the chip. The resistors are equal in value to a termination resistor less the output impedance of the emitter followers. There is a pair of signal leads, referred to as the primary and secondary leads connected to the resistors. The current traversing the secondary lead has the same amplitude, but the opposite sign as the current traversing the primary lead. Thus there is negligible current return through the common ground leads. This design can be implemented in various logic families including ECL (emitter coupled logic), GaAs, and BiCMOS (bipolar complementary metal-oxide semiconductor) technologies. The driver can also be used for other purposes when driving balanced interconnections on printed wiring boards (PWBs) and multichip modules (MCMs).

BRIEF DESCRIPTION OF THE DRAWINGS

The nature, advantages and various additional features of the invention will appear more fully upon consideration of the illustrative embodiment now to be described in detail in connection with the accompanying drawings. In the drawings.

It is to be understood that these drawings are for purposes of illustrating the concepts of the invention and are not to scale.

DETAILED DESCRIPTION

Figure 1:
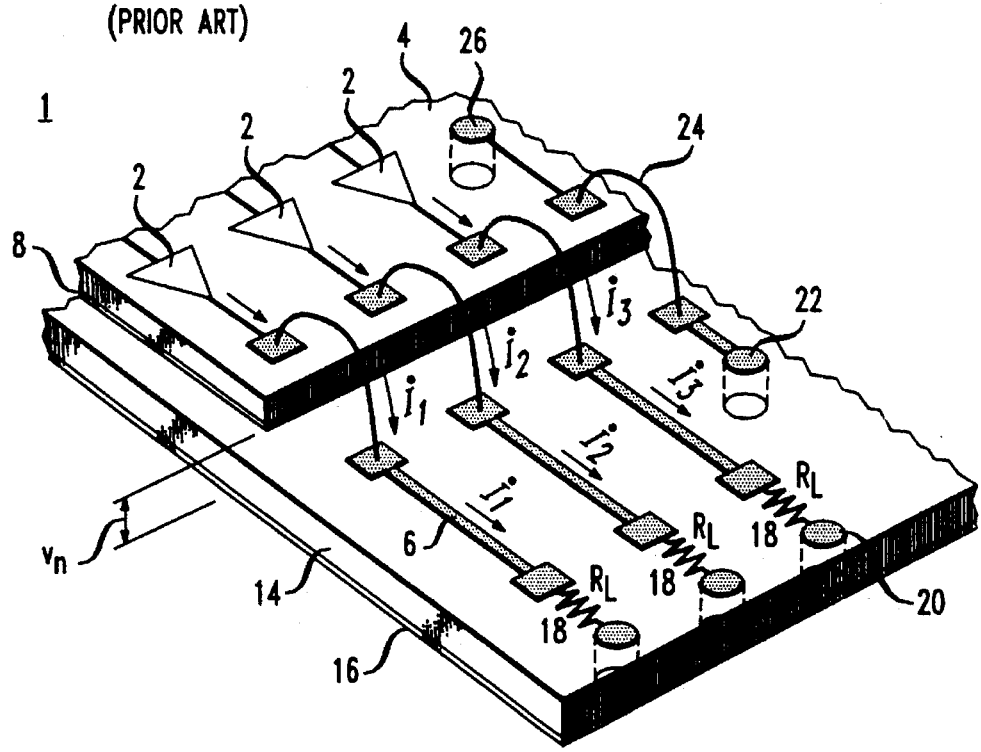
FIG. 1 shows the conventional AC circuit used to drive unbalanced transmission lines.

Referring to the drawings, FIG. 1 illustrates the conventional method used to drive unbalanced transmission lines 6 on a printed wiring board 14 (PWB). Only the AC portion of the circuit is displayed, thus the power supply voltages, bias resistors, voltage planes and by-pass capacitors are omitted. A problem associated with such unbalanced chip driver circuits 1 is that an induced transient potential difference occurs between the ground plane 8 present in the driver integrated circuit 4 and the ground plane 16 associated with the interconnect 14 i.e., PWB, MCM, that provides electrical communication between the integrated circuits. The difference in ground potential is proportional to the rate of change of the driver current, the number of chip drivers switching, and the combined inductance of the ground return. The rate of change of ground return current, $\dot{I}_g$, flows from the terminations 18 located at the chip receivers (not shown), through the ground vias 20, ground plane 16, ground via at the chip 22, wire bond 24 of the chip 4, ground via 26 on the chip 4, and finally to the chip ground plane 8. The magnitude of the inductive noise developed between the two ground planes 8 and 16 is indicated as $v_n$. Neglecting mutual inductances, inductive noise is given, approximated by $$v_n = \frac{L_s(n\dot{I})}{N_g} \qquad (1)$$

where $L_s$=self inductance of the ground return path n=number of chip drivers switching simultaneously in the same direction İ=rate of change of the signal current (ma/ns)

$N_g$=number of ground leads on the chip.

Thus, for n=8, $N_g$=3, İ=20 ma/ns, (i.e. $\frac{1 V}{(50\Omega)(1 ns)}$)

and $L_S$= 2.62 nH (i.e., a 100 mil wire bond), equation (1) yields an inductive noise $v_n$= 140 mv. This value of $v_n$ is significant especially since crosstalk can contribute an equal amount of noise. Additionally as the rise time of the chip is reduced from 1 ns to a value of 0.1 ns, $v_n$ increases by an order of magnitude which causes the inductive noise to become overwhelming.

Figure 2:
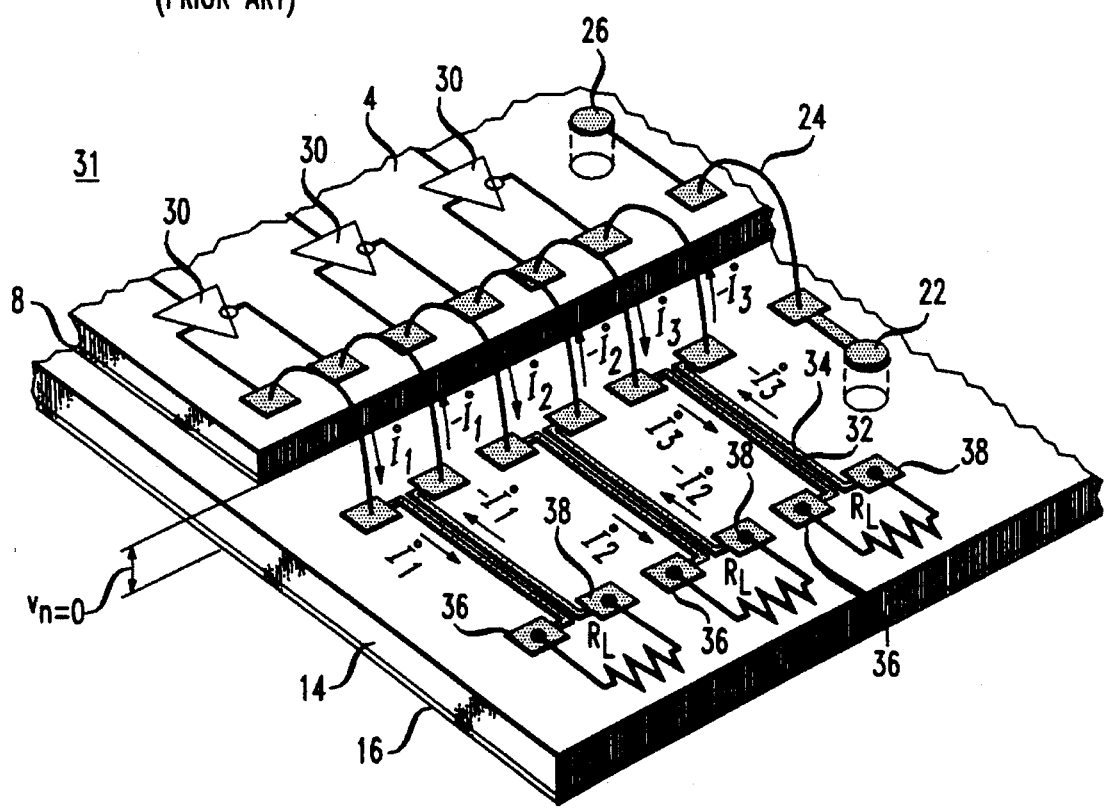
FIG. 2 shows a conventional AC circuit section used to drive balanced transmission lines.

The inductive noise, $v_n$ can be reduced to a negligible amount by replacing each unbalanced chip driver 2 with a balanced chip driver 30 as illustrated in FIG. 2. There is a pair of driver leads designated as the primary and secondary leads 32 and 34. This correspondence of a pair 32 and 34 is continued to pads 36 and 38 and to the chip receiver (not shown) in the interconnecting equipment i.e., other IC's in the multichip module (MCM) or other IC's on the PWB. Thus the current traversing the secondary lead 34 has the same amplitude, but the opposite sign as the current traversing the primary lead 32, thus, creating no inductive noise. A drawback of using a conventional balanced chip driver circuit 31 is that twice as much power is needed as compared to the unbalanced driver circuit 1. Further discussion can be found in U.S. patent application No. 07/841,139, filed on Feb. 25, 1992, entitled Balanced Circuitry For Reducing Inductive Noise Of External Chip Interconnections which is incorporated by reference herein.

This invention replaces the unbalanced driver circuit 1 with a balanced driver circuit 28 which essentially eliminates inductive noise while dissipating the same amount of power as the unbalanced driver circuit 1. This is accomplished by simply replacing each unbalanced driver 2 with a balanced driver 30 illustrated in FIGS. 3 and 5. The balanced driver 30 is comprised of two emitter follower output stages 40 and 42 which are each connected in series with a resistor 44 and 46. The resistors 44 and 46 are each connected in series to either a primary or secondary signal lead 32 and 34 which together is referred to as a balanced transmission line. Terminating the balanced transmission line 32 and 34 are termination resistors 48 and 50. A power supply 52 is connected to the center-tap of the termination resistors 48 and 50. A receiver 53 is connected in parallel to the termination resistors 48 and 50.

The balanced transmission line 32 and 34 is impedance matched at both ends. The emitter followers 40 and 42 have an output impedance designated as $R_O$. The termination resistors 48 and 50 have values designated as $R_B$. The resistors 44 and 46 each have a value which is equal to the termination resistor 48 or 50 less the output impedance from the emitter followers 40 and 42 designated by $R_B$-$R_O$.

The pair of signal leads 32 and 34 are internally connected to the integrated circuit so that the current traversing the secondary lead 34 has the same amplitude, but the opposite sign as the current traversing the primary lead 32 as in a conventional balanced chip driver. Thus, no inductive noise, $v_n$=0, is produced since there is no net rate of change of current flow, İ$_g$=0, in the ground return path. Additionally the impedance between the leads 32 and 34 is designated as $Z_B$ and is equal to twice the value of the termination resistor 48 or 50.

The power dissipation resulting from the balanced driver circuit 28 is equal to the power dissipation resulting from the unbalanced driver circuit 1 as a result of the addition of resistors 44 and 46. The value of the resistors 44 and 46 must be of a value equal to the termination resistor 48 or 50 less the output impedance from the emitter follower 40 and 42. The determination of the equal power dissipation condition follows.

Figure 4:
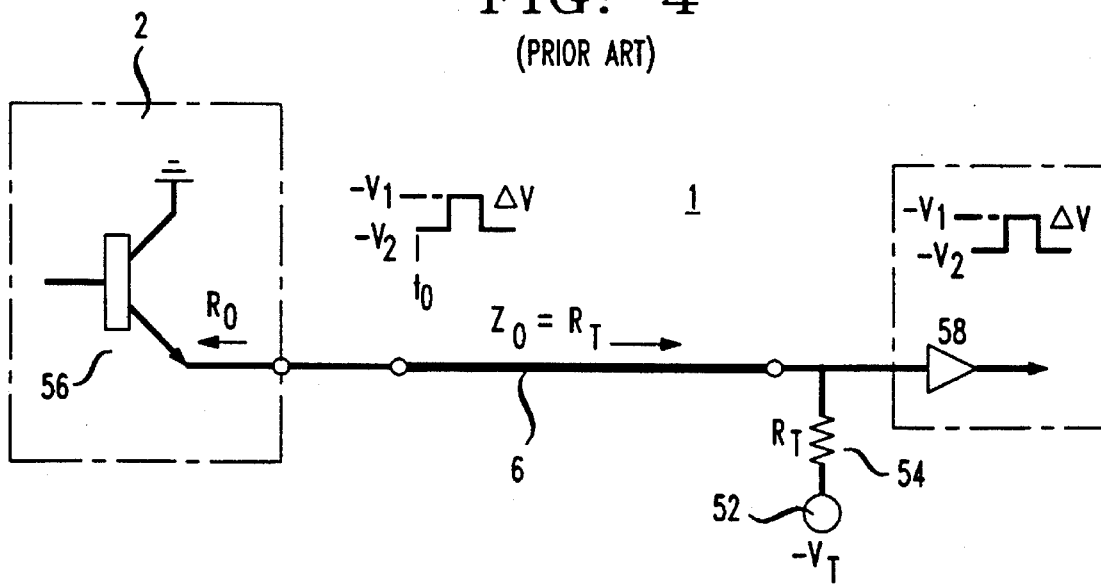
FIG. 4 illustrates a conventional output circuit for an unbalanced driver circuit using ECL or BiCMOS logic for the on-chip driver circuitry.
Figure 6:
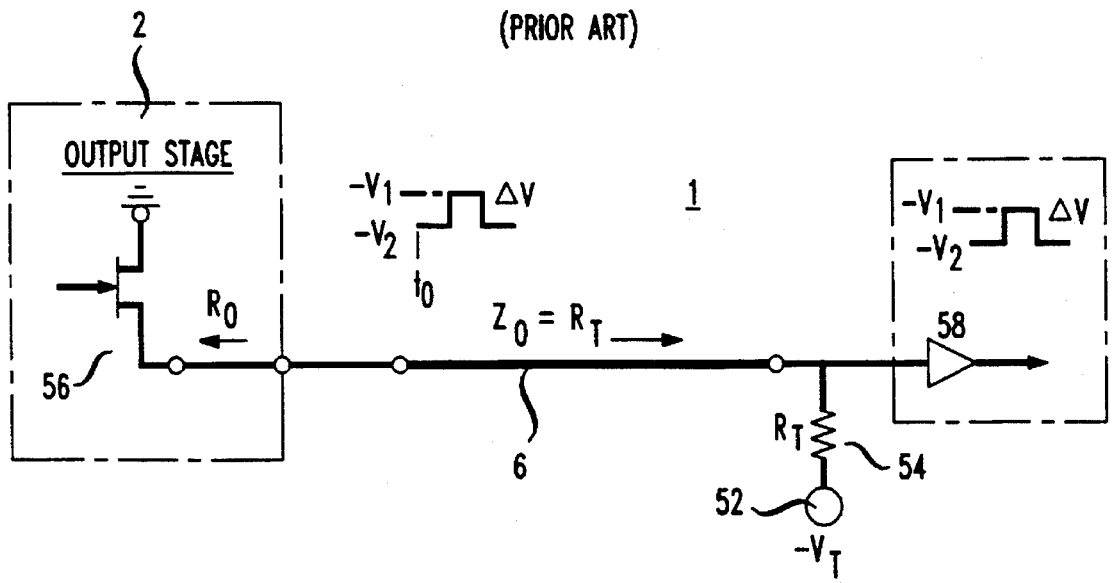
FIG. 6 illustrates a conventional output circuit for an unbalanced driver circuit using GaAs logic for the on-chip driver circuitry.

FIGS. 4 and 6 illustrate the output portion of a conventional unbalanced driver circuit 1 which is impedance matched at the receiver end only. The unbalanced driver circuit 1 is comprised of an emitter follower output stage 56 which has an output impedance designated by $R_O$, a signal or transmission line 6 which has an impedance designated by $Z_O$, a termination resistor 54 which has a value designated by $R_T$, a power supply 52 which has a voltage designated by $-V_T$ and a receiver 58. $-V_1$ and $-V_2$ designate the two logic levels experienced by the circuit. The time average power dissipated by the output portion of the unbalance circuit 1 is given by $$\bar{P}_U = \left[\frac{1}{2}\right]\left[\frac{V_T(V_T - V_1)}{R_T} + \frac{V_T(V_T - V_2)}{R_T}\right] \quad (2)$$

or $$\bar{P}_U = \frac{V_T(2V_T - V_2 - V_1)}{2R_T} \quad (3)$$

The dissipated power of the output portion of the unbalanced circuit 1 can also be given by $$\bar{P}_U = \bar{P}_{Ui} + \bar{P}_{Ue} \quad (4)$$

where $\bar{P}_{Ui}$=average unbalanced power dissipated internal to the chip (i.e., the emitter follower 56) and $\bar{P}_{Ue}$=average unbalanced power dissipated external to the chip (i.e., the termination resistor 54). $\bar{P}_{Ui}$ is given by $$\bar{P}_{Ui} = \frac{V_2(V_T - V_2) + V_1(V_T - V_1)}{2R_T} \quad (5)$$

and $\bar{P}_{Ue}$ is given by $$\bar{P}_{Ue} = \frac{(V_T - V_2)^2 + (V_T - V_1)^2}{2R_T} \quad (6)$$

The power dissipated by the output portion of the balanced circuit 28 which contains resistors 44 and 46, can be considered as twice the unbalanced portion but with $R_T$=2$R_B$-$R_O$. Accordingly, $$\bar{P}_B = 2\bar{P}_U|_{R_T=2R_B-R_O} \quad (7)$$

and $$\frac{\bar{P}_B}{\bar{P}_U} = \frac{2R_T}{2R_B - R_O} \quad (8)$$

In analogy with equation (4), the power dissipated in the output portion of the balanced circuit 28 can be given by $$\bar{P}_B = \bar{P}_{Bi} + \bar{P}_{Be} \quad (9)$$

where $\bar{P}_{Bi}$=average balanced power dissipated internal to the chip, i.e., the two emitter followers 40 and 42, and $\bar{P}_{Be}$=average balanced power dissipated external to the chip, i.e., the four resistors 44, 46, 48, 50.

$\bar{P}_{Bi}$ is given by $$\bar{P}_{Bi} = 2\bar{P}_{Ui}|_{R_T=2R_B-R_O} \quad (10)$$

$\bar{P}_{Be}$ is given by $$\bar{P}_{Be} = 2\bar{P}_{Ue}|_{R_T=2R_B-R_O} \quad (11)$$

By imposing the constraint that the power dissipated by the output portions of the balanced 28 and unbalanced driver 1 circuits be equal, then from equation (8) the following results $$\frac{P_B}{P_U} = 1 \quad (12)$$

or $$R_B = R_T + \frac{R_0}{2} \quad (13)$$

and $$Z_B = 2R_B = 2R_T + R_0 \quad (14)$$

Interestingly, equation (8) is a general result that holds for general integrated circuit drivers independent of the operating voltages $V_T$, $V_2$, and $V_1$.

Figure 3:
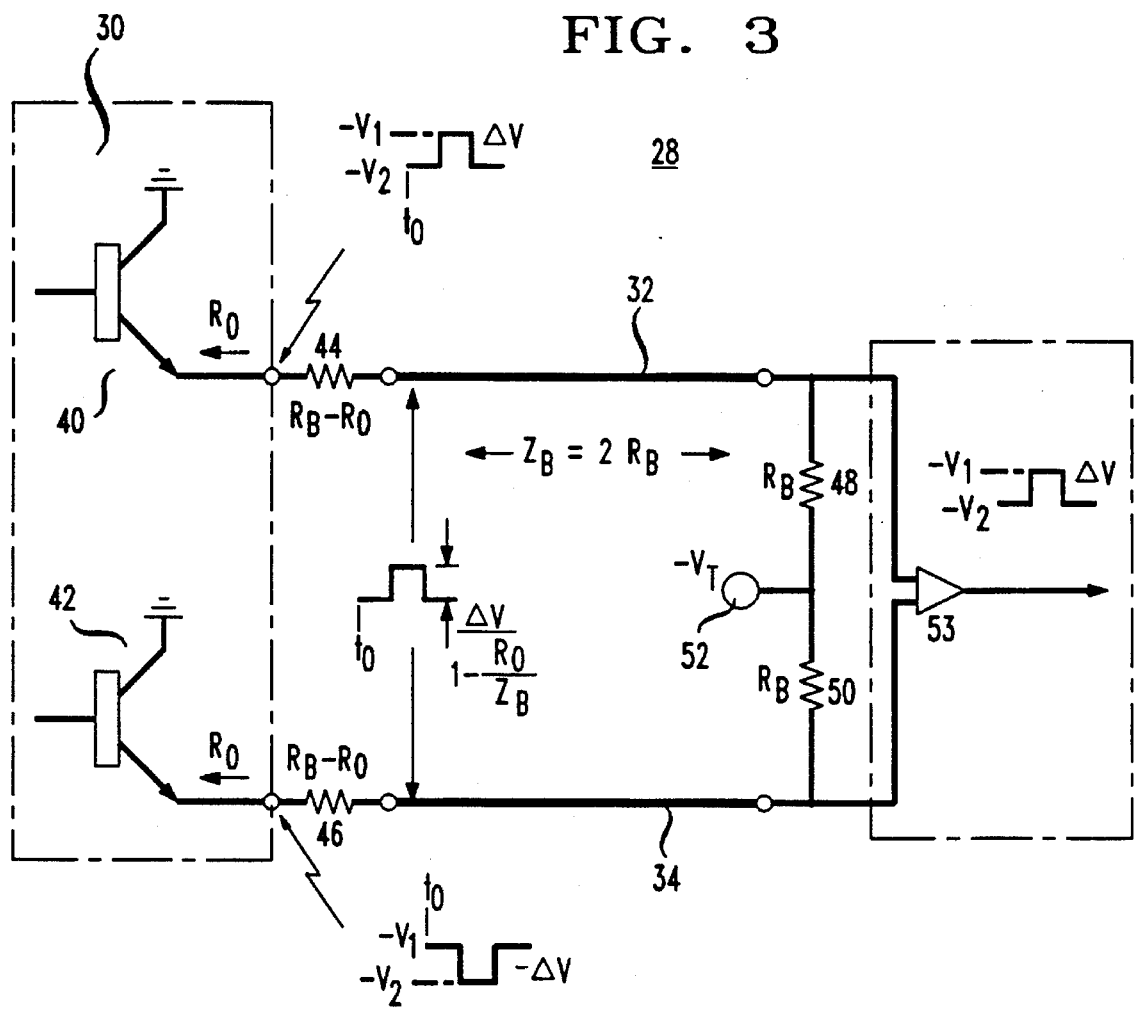
FIG. 3 illustrates the output circuit for a balanced driver circuit according to the invention that exemplarily uses ECL or BiCMOS logic for the on-chip driver circuitry.
Figure 5:
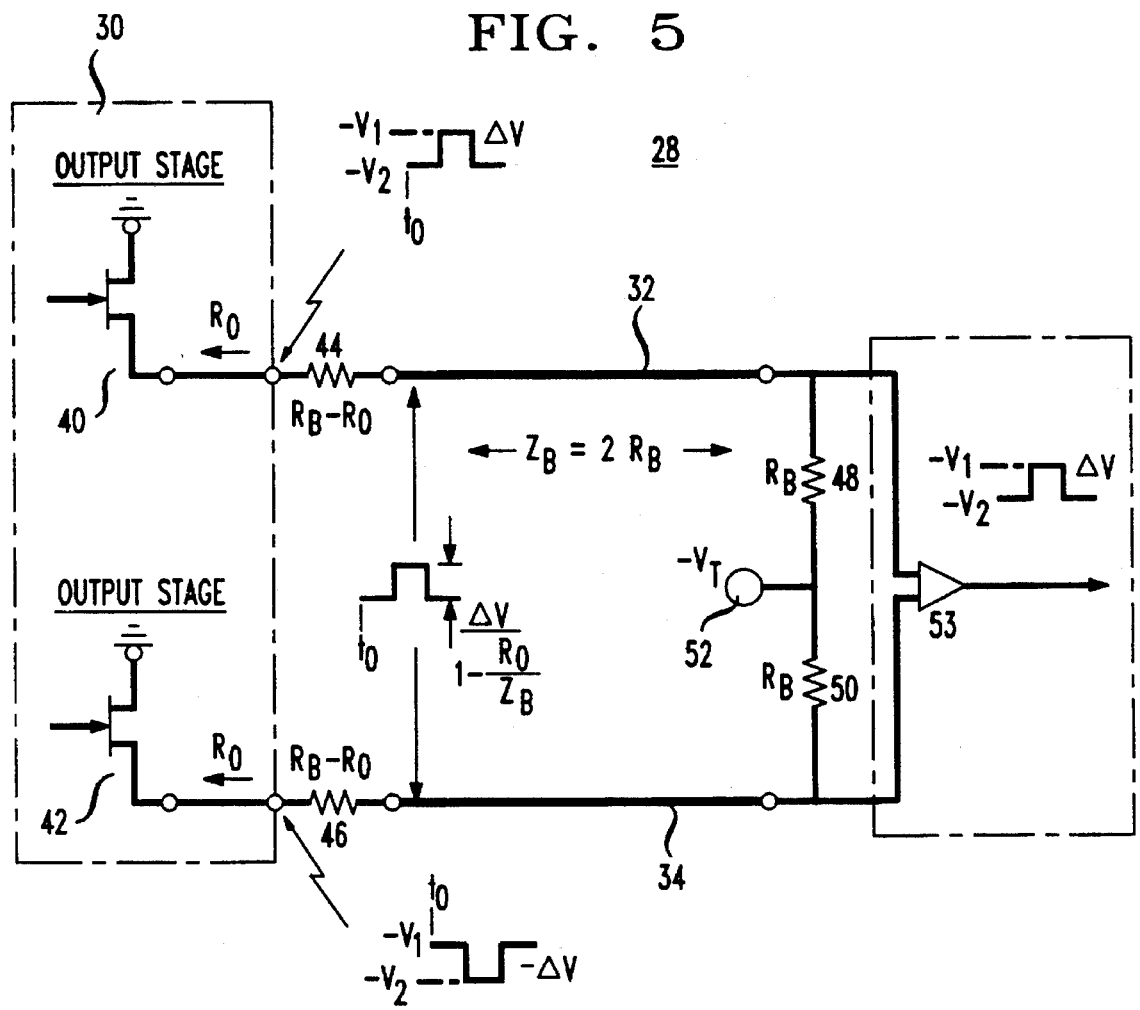
FIG. 5 illustrates the output circuit for an exemplary balanced driver circuit according to the invention that comprises GaAs logic for the on-chip driver circuitry.

This design can be implemented in various logic families including ECL, BiCMOS (as shown in FIG. 3) and GaAs (as shown in FIG. 5). For example when using ECL technology, let $V_T=2$ volts, $V_2=1.705$ volts, $V_1=0.955$ volts, $R_T=50$ ohms, and $R_O=6$ ohms. Using such values produced the following yields for unbalanced as well as balanced driver circuits.

| Average Power Dissipation of ECL Driver Circuits Having $R_0 = 6\Omega$ | |
|---|---|
| Unbalanced Driver | Balanced Driver |
| ($R_T = 50\Omega$, $Z_0 = 50\Omega$) | ($R_B = 53\Omega$, $Z_B = 106\Omega$) |
| $\bar{P}_U = 26.80$ mW | $\bar{P}_B = 26.80$ mW |
| $\bar{P}_{Ui} = 15.01$ | $\bar{P}_{Bi} = 15.01$ |
| $\bar{P}_{Ue} = 11.79$ | $\bar{P}_{Be} = 11.79$ |

The remaining portions of the output portion of the unbalanced 2 and balanced 30 on-chip drivers not shown in FIGS. 3–6 are identical and dissipate equal power. Thus, the values of $\bar{P}_{Ui}$ and $\bar{P}_{Bi}$ only account for the average power dissipated by the output emitter followers 56 or 40 and 42 respectively. To account for the power dissipated in the remaining portion of the on-chip ECL driver circuitry, a common power dissipation of about 25 mW must be added to both $\bar{P}_{Ui}$ and $\bar{P}_{Bi}$. ECL technology shown in FIG. 3 can be replaced with comparable GaAs technology as shown in FIG. 5 with analagous results. For unbalanced 2 and balanced 30 GaAs drivers, assume $V_T=2$ volts, $V_2=1.9$ volts, $V_1=0.4$ volts, $R_T=50$ ohms, $R_O=8$ ohms, and $R_B=54$ ohms. The above equations yield $\bar{P}_U=\bar{P}_B=34$ mW, $\bar{P}_{Ui}=\bar{P}_{Bi}=8.3$ mW, and $\bar{P}_{Ue}=\bar{P}_{Be}=25.7$ mW. Also, for GaAs the on-chip driver power dissipation not included in $\bar{P}_{Ui}$ and $\bar{P}_{Bi}$ is about 225 mW rather than 25 mW for ECL technology and the GaAs drivers operate 3–5 times faster than ECL drivers. Implementation using high-speed CMOS (complementary metal oxide semiconductor) technology compatible with ECL logic levels also results in essentially eliminating the inductive noise. However, the circuit dissipates twice the average power dissipated by the unbalanced driver circuit 1.

The balanced driver circuit 28 can be used in conjunction with the current chip attachment technique of wire bonds thus making use of the large capital investment in wire bonding automation as well as with new low noise chip attachment technologies such as solder bumps and TAB. The balanced driver circuit 28 provides for the introduction of digital architectures that require large digital words to switch in approximately 0.1 ns or less. When the balanced driver circuit 28 is used to drive balanced interconnections on PWBs 14 and MCMs as described in U.S. patent application No. 07/841,139, filed on Feb. 25, 1992, entitled Balanced Circuitry For Reducing Inductive Noise Of External Chip Interconnections substantial benefits of reduced crosstalk, increased noise immunity and elimination of ground noise results. Finally, the balanced driver circuit 28 is well suited for high-speed optoelectronics, and the introduction of high temperature superconducting interconnections on MCMs and in high density, high performance electronic systems.

It is to be understood that the above-described balanced driver circuit is illustrative of only a few of the many possible specific embodiments which can represent applications of the principles of the invention. Numerous and varied other arrangements such as replacing the emitter followers with other balanced driver configurations or compensating for the resistors 44 and 46 within the integrated circuit can be readily devised in accordance with these principles by those skilled in the art without departing from the spirit and scope of the invention.

I claim:

1. An article comprising a circuit for driving electrical signal output leads of an integrated circuit comprising:

first and second emitter follower transistor output stages each having an output impedance $R_O$ and an output terminal;

first and second resistors, serially connected to said first and second emitter follower output terminal, respectively;

first and second transmission lines, serially connected to said first and second emitter follower output terminals through said first and second resistors, respectively, each of said transmission lines having an output end;

first and second termination resistors connected serially between said first and second transmission line output ends;

a voltage supply connected between said first and second termination resistors; and a receiver connected between said first and second transmission line output ends; and wherein each of said first and second termination resistors has resistance essentially equal to $R_B$, and where each of said first and second resistors has resistance essentially equal to $R_B$–$R_O$.

2. An article according to claim 1 wherein at least said emitter follower output stages are implemented using emitter coupled logic.

3. An article according to claim 1 wherein at least said emitter follower output stages are implemented using GaAs logic.

4. An article according to claim 1 wherein at least said emitter follower output stages are implemented using bipolar complementary metal oxide semiconductor logic.

\* \* \* \* \*